(12) United States Patent
Zhang et al.

(10) Patent No.: US 10,115,355 B2
(45) Date of Patent: Oct. 30, 2018

(54) SHIFT REGISTER

(71) Applicant: Shenzhen China Star Optoelectronics Technology Co., Ltd., Shenzhen, Guangdong (CN)

(72) Inventors: Shengdong Zhang, Guangdong (CN); Zhijin Hu, Guangdong (CN); Congwei Liao, Guangdong (CN); Shijie Cao, Guangdong (CN); Chang-yeh Lee, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 278 days.

(21) Appl. No.: 15/023,407

(22) PCT Filed: Dec. 30, 2015

(86) PCT No.: PCT/CN2015/099677
§ 371 (c)(1),
(2) Date: Mar. 21, 2016

(87) PCT Pub. No.: WO2017/101158
PCT Pub. Date: Jun. 22, 2017

(65) Prior Publication Data
US 2018/0040283 A1 Feb. 8, 2018

(30) Foreign Application Priority Data

Dec. 15, 2015 (CN) .......................... 2015 1 0932745

(51) Int. Cl.
G09G 3/36 (2006.01)
G11C 19/08 (2006.01)
G11C 19/28 (2006.01)

(52) U.S. Cl.
CPC ........... *G09G 3/36* (2013.01); *G11C 19/0841* (2013.01); *G11C 19/287* (2013.01); *G09G 2310/0286* (2013.01)

(58) Field of Classification Search
CPC ..................................................... G09G 3/36
See application file for complete search history.

(56) References Cited

U.S. PATENT DOCUMENTS 6,556,646 B1  4/2003  Yeo et al.
8,537,963 B2 * 9/2013  Chen ..................... G11C 19/28
                                                    377/64

(Continued)

FOREIGN PATENT DOCUMENTS

CN        102509537 A    6/2012
CN        103280196 A    9/2013

*Primary Examiner* — Hai L Nguyen
(74) *Attorney, Agent, or Firm* — Andrew C. Cheng

(57) ABSTRACT

A shift register is disclosed. The shift register comprises a multistage shift register units. Each of the stage shift register unit comprises: a driving module, charging to the driving signal via the first clock signal based on the driving control signal; an input module, outputting the driving control signal based on the second clock signal and the first control signal; a low level maintenance module, keeping the potential of the driving signal at the low level potential of the second reference. The shift register can avoid the leakage from the first output end, decrease the raising time of the driving signal and occupy the small area.

15 Claims, 7 Drawing Sheets

(56) References Cited

U.S. PATENT DOCUMENTS

| | | | |
|---|---|---|---|
| 8,803,783 B2* | 8/2014 | Ochiai | G09G 3/3677 345/100 |
| 9,576,543 B2* | 2/2017 | He | G09G 3/3648 |
| 9,590,632 B2* | 3/2017 | Nagao | G09G 3/3648 |
| 9,640,276 B2* | 5/2017 | Li | G11C 19/28 |
| 9,741,304 B2* | 8/2017 | Yao | G09G 3/3648 |
| 2008/0056430 A1 | 3/2008 | Chang et al. | |
| 2010/0141641 A1 | 6/2010 | Furuta et al. | |
| 2016/0343338 A1 | 11/2016 | Gu et al. | |

* cited by examiner

SHIFT REGISTER

FIELD OF THE DISCLOSURE

The present disclosure relates to a liquid crystal display technology field, and more particularly to a shift register.

BACKGROUND OF THE DISCLOSURE

Flat-Panel-Display becomes the main stream in the display technology which develops toward higher frame frequency, higher resolution and narrower frame in recent years. The integrated display driver circuit refers to the gate drive circuit and the data driver circuit and other peripheral circuits with thin-film transistor (TFT) in the form of pixel TFT—from production on the display panel. Compared with the traditional process, using integrated display driven approach not only reduces the number of peripheral driver chips and packer procedures, reduce costs, but also makes the peripheral more slim monitor, the display module more compact, mechanical and electrical reliability resistance is enhanced.

In the integrated display driver circuit, the shift register is the important circuit module which achieves the integrated gate (row) driving circuit and the integrated data (column) driving circuit. Based on the shift register with the amorphous silicon TFT, one limitation is low drift mobility so that it is hard to promote the work frequency; the other limitation is the larger circuit area, so the requirement is harder and harder to satisfy in the practical way. Because the oxide semiconductor TFT has the advantages of smooth characteristic, high drift mobility, good stability and low cost manufacture, it becomes the TFT technology of general concern in the recent year. The integrated shift register circuit of the oxide semiconductor also has some elemental research.

In the existing circuit structure of the shift register, the capacitance bootstrapping effect is used to enhance the driving power of the transistor, such that further to speed up the charging of the output load. Because of the reason of the leakage existing in the internal circuit or the larger size of the controlling capacitance of the driving transistor in the traditional shift register circuit, the control electrode of the driving transistor can bootstrap to the high potential. The raising time of the output pulse is longer to enhance limitation of the work frequency of the circuit. Especially, when the temperature is high and the threshold value of TFT is smaller, the effect will be more serious. On the other side, when the output load of the shift register is higher, the traditional shift register needs the large size pull-down tube to charge the load so the circuit area is usually large. It is not easily applied in the high resolution display.

SUMMARY OF THE DISCLOSURE

The present disclosure provides a shift register to overcome the above mentioned problem.

A shift register, wherein the shift register comprises a plurality of shift register units, and at least one the shift register unit comprises: a driving module, comprising:

an input end, connecting to a first clock signal; a control end, for receiving a driving control signal; a first output end, for outputting a driving signal, and the driving module charges and discharges to the driving control signal through the first clock signal based on the driving control signal; an input module, connecting to the control end, the input module outputs the driving control signal based on a second clock signal and a first control signal; a low level maintenance mean, connecting to the first output end, for keeping level potential of a first reference voltage, a third clock signal, the first clock signal and the first control signal at low level potential of a second reference voltage; wherein, the driving module comprises a first thin film transistor and a first capacitance, and a first end of the first thin film transistor connecting to the first clock signal, a second end of the first thin film transistor connecting to the input module, a third end of the first thin film transistor being used for outputting the driving signal, one end of the first capacitance connecting to a second end of the first thin film transistor, another end of the first capacitance connecting to the third end of the first thin film transistor; the input module comprising: a second thin film transistor and a third thin film transistor, a first end of the second thin film transistor connecting to a first end of the third thin film transistor, a second end of the second thin film transistor connecting to the second clock signal, a third end of the second thin film transistor and a third end of the third thin film transistor connecting to the second end of the first thin film transistor, the first end and the second end of the third thin film transistor connecting to the first control signal; the low level maintenance mean comprising: a fourth thin film transistor, a fifth thin film transistor, a sixth thin film transistor, a seventh thin film transistor, a eighth thin film transistor and a second capacitance, a first end of the fourth thin film transistor and the first end of the fifth sixth thin film transistor connecting to the first reference voltage, a second end of the fourth thin film transistor connecting to a first end of the sixth thin film transistor, a third end of the fourth thin film transistor and a third end of the fifth thin film transistor connecting to a second end of the eighth thin film transistor, a second end of the fifth thin film transistor connecting to the third clock signal, a first end of the sixth thin film transistor connecting to the first clock signal a third end of the sixth thin film transistor by and the second capacitance, a second end of the sixth thin film transistor and a second end of the seventh thin film transistor connecting to the first control signal, the second end of the sixth thin film transistor and the second end of the seventh thin film transistor connecting to the first control signal, the third end of the sixth thin film transistor, the third end of the seventh thin film transistor and a third end of the eighth thin film transistor connecting to the second reference voltage, and the first end of the first seventh thin film transistor connecting to the second end of the eighth thin film transistor, the first end of the eighth thin film transistor connecting to the third end of the first thin film transistor.

The shift register further comprises an initialization module, respectively connecting to the control end and the second reference voltage, the initialization module is used for pulling the driving control signal down to the low level potential of the second reference voltage.

The initialization module comprises a ninth thin film transistor, a first end of the ninth thin film transistor connecting to the second end of the first thin film transistor, a second end of the ninth thin film transistor connecting to initialization pulse signal, a third end of the ninth thin film transistor connecting to the second reference voltage.

The driving module further comprises a second output end, connecting to a next stage shift register for providing an input signal for the next stage shift register.

The second output end comprises a tenth thin film transistor, a first end of the tenth thin film transistor connecting to the first clock signal, a second end of the tenth thin film transistor connecting to the second end of the first thin film transistor, a third end of the tenth thin film transistor connecting to the next stage shift register.

The low level maintenance mean further comprises an eleventh thin film transistor, a first end of the eleven thin film transistor connecting to the third end of the tenth thin film transistor, a second end of the eleventh thin film transistor connecting to the second end of the eighth thin film transistor, a third end of the eleventh thin film transistor connecting to the second reference voltage.

The first thin film transistor, the second thin film transistor, the third thin film transistor, the fourth thin film transistor, the fifth thin film transistor, the sixth thin film transistor, the seventh thin film transistor, the eighth thin film transistor, the ninth thin film transistor, the tenth thin film transistor and the eleventh thin film transistor are N-type thin film transistors.

Another shift register is further provided, which comprises a plurality of shift register units, and at least one the shift register unit comprises: a driving module, comprising: an input end, connecting to a first clock signal; a control end, for receiving a driving control signal; a first output end, for outputting a driving signal, and the driving module charges and charges to the driving control signal through the first clock signal based on the driving control signal; an input module, connecting to the control end, the input module outputs the driving control signal based on a second clock signal and a first control signal; a low level maintenance mean, connecting to the first output end, for keeping level potential of a first reference voltage, a third clock signal, the first clock signal and the first control signal at low level potential of a second reference voltage.

the driving module comprises a first thin film transistor and a first capacitance, and a first end of the first thin film transistor connecting to the first clock signal, a second end of the first thin film transistor connecting to the input module, a third end of the first thin film transistor being used for outputting the driving signal, one end of the first capacitance connecting to the second end of the first thin film transistor, other end of the first capacitance connecting to the third end of the first thin film transistor.

The input module comprising: a second thin film transistor and a third thin film transistor, a first end of the second thin film transistor connecting to a first end of the third thin film transistor, a second end of the second thin film transistor connecting to the second clock signal, a third end of the second thin film transistor and a third end of the third thin film transistor connecting to the second end of the first thin film transistor, the first end and the second end of the third thin film transistor connecting to the first control signal.

the low level maintenance mean comprising: a fourth thin film transistor, a fifth thin film transistor, a sixth thin film transistor, a seventh thin film transistor, a eighth thin film transistor and a second capacitance, a first end of the fourth thin film transistor and the first end of the fifth sixth thin film transistor connecting to the first reference voltage, a second end of the fourth thin film transistor connecting to a first end of the sixth thin film transistor, a third end of the fourth thin film transistor and a third end of the fifth thin film transistor connecting to a second end of the eighth thin film transistor, a second end of the fifth thin film transistor connecting to the third clock signal, a first end of the sixth thin film transistor connecting to the first clock signal a third end of the sixth thin film transistor by and the second capacitance, a second end of the sixth thin film transistor and a second end of the seventh thin film transistor connecting to the first control signal, the second end of the sixth thin film transistor and the second end of the seventh thin film transistor connecting to the first control signal, the third end of the sixth thin film transistor, the third end of the seventh thin film transistor and a third end of the eighth thin film transistor connecting to the second reference voltage, and the first end of the seventh thin film transistor connecting to the second end of the eighth thin film transistor, the first end of the eighth thin film transistor connecting to the third end of the first thin film transistor.

The shift register further comprises an initialization module, respectively connecting to the control end and the second reference voltage, the initialization module is used for pulling the driving control signal down to the low level potential of the second reference voltage.

The initialization module comprises a ninth thin film transistor, a first end of the ninth thin film transistor connecting to the second end of the first thin film transistor, a second end of the ninth thin film transistor connecting to initialization pulse signal, a third end of the ninth thin film transistor connecting to the second reference voltage.

The driving module further comprises a second output end, connecting to a next stage shift register for providing an input signal for the next stage shift register.

The second output end comprises a tenth thin film transistor, a first end of the tenth thin film transistor connecting to the first clock signal, a second end of the tenth thin film transistor connecting to the second end of the first thin film transistor, a third end of the tenth thin film transistor connecting to the next stage shift register.

The low level maintenance mean further comprises a eleventh thin film transistor, a first end of the eleven thin film transistor connecting to the third end of the tenth thin film transistor, a second end of the eleventh thin film transistor connecting to the second end of the eighth thin film transistor, a third end of the eleventh thin film transistor connecting to the second reference voltage.

The first thin film transistor, the second thin film transistor, the third thin film transistor, the fourth thin film transistor, the fifth thin film transistor, the sixth thin film transistor, the seventh thin film transistor, the eighth thin film transistor, the ninth thin film transistor, the tenth thin film transistor and the eleventh thin film transistor are N-type thin film transistors.

Via the above mentioned solution, the shift register of the present disclosure has the advantages which the shift register comprises a plurality of stage shift register units. Each of the stage shift register unit comprises: a driving module, an input module, and a low level maintenance mean. The driving module charges or discharges to the driving signal through the first clock signal based on the driving control signal. The input module outputs the driving control signal based on the second clock signal and the first control signal. The low level maintenance mean keeps the driving signal at the low level potential of the second reference voltage. When the first clock signal charges to the driving signal, the low level maintenance mean breaks up the connection with the first output end to avoid the leakage from the first output end and to reduce the raising time of the driving signal. When the first signal charges to the driving signal, the low level maintenance mean connects to the first output end. The driving signal discharges quickly via the first clock signal and the low level maintenance mean. The area of the shift register is small.

BRIEF DESCRIPTION OF THE DRAWINGS

Below in conjunction with the accompanying drawings, the present invention will be described in detail by specific embodiments, the present invention will enable technology and other beneficial effect is obvious.

In the drawings.

DETAILED DESCRIPTION OF PREFERRED EMBODIMENTS

Hereinafter, the present invention in conjunction with the accompanying drawings which illustrate, were clearly the technical solution of the embodiment of the present invention, fully described, obviously, the described embodiments are merely part of embodiments of the present invention, but not all embodiments cases. Based on the embodiments of the present invention, all other embodiments to those of ordinary skill in the premise of no creative efforts obtained, are within the scope of protection of the present invention.

Figure 1:
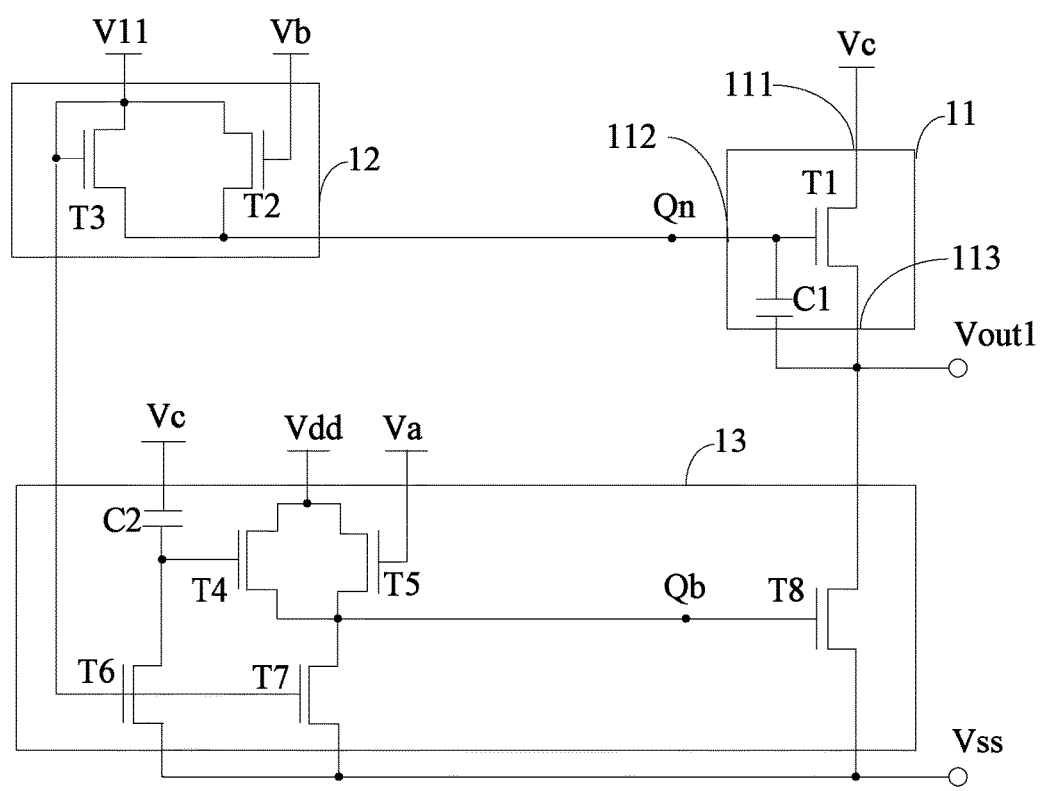
FIG. 1 is a circuit diagram of the shift register unit of the first embodiment.

Refer to FIG. 1, which is a circuit diagram of a shift register of the first embodiment according to the present disclosure. The shift register unit disclosed by the present embodiment is applied in the shift register. As shown in FIG. 1, at least one level shift register unit comprises: a driving module 11, an input module 12 and a low level maintenance mean 13.

The driving module 11 comprises an input end 111, a control end 112 and a first output end 113, where the input end 111 connects to the first clock signal Vc, and the control end 112 connects to the input module 12 for receiving the driving control signal Qn and a first end 113 connects to the load for outputting the driving signal Vout1. The driving module 11 charges to the driving control signal Vout1 through the first clock signal Vc based on the driving signal Qn. The input module 12 outputs the driving control signal Qn based on the second clock signal Vb and the first control signal V11 and the low level maintenance mean 13 connects with the first output end 113 for keeping the level potential of the driving signal Vout1 at the low level of the second reference voltage Vss based on the first reference voltage Vdd, the third clock signal Va, the first clock signal Vc and the first control signal V11 when the driving module 11 charges or discharges the driving signal Vout1 through the first clock signal Vc based on the driving control signal Qn.

Particularly, the driving circuit 11 comprises the first thin film transistor T1 and the first capacitance C1, and the first end of the first thin film transistor T1 connects to the first clock signal Vc, the second end of the first transistor T1 connecting to the input end 12, and the third end of the first thin film transistor T1 is used for outputting the driving signal Vout1, and one end of the first capacitance C1 connects to the second end of the first thin film transistor T1 and the other end of the first capacitance C1 connects to the third end of the first thin film transistor T2, where the first end of the first thin film transistor T1 is an input end 111, the second end of the first thin film transistor T1 is a control end 112, and the third end of the first thin film transistor T1 is the first output end 113.

The input module 12 comprises the second thin film transistor T2 and the third thin film transistor T3. The first end of the second thin film transistor T2 connects to the first end of the third thin film transistor T3. The second end of the second thin film transistor T2 connects to the second clock signal Vb. The third end of the second thin film transistor T2 and the third end of the third thin film transistor T3 connects to the second end of the first thin film transistor T1. The first end and the second end of the third thin film transistor T3 connects to the first control signal V11. Further, the third end of the second thin film transistor T2 and the third end of the third thin film transistor T3 output the driving control signal Qn.

The low level maintenance mean 13 comprises the fourth thin film transistor T4, the fifth thin film transistor T5, the sixth thin film transistor T6, the seventh thin film transistor T7, the eighth thin film transistor T8 and the second capacitance C2. The first end of fourth thin film transistor T4 and the first end of the fifth thin film transistor T5 connects to the first reference voltage Vdd. The second end of the fourth thin film transistor T4 connects to the first end of the sixth thin film transistor T6. The third end of the fourth thin film transistor T4 and the third end of the fifth thin film transistor T5 connects to the second end of the eighth thin film transistor T8. The second end of the fifth thin film transistor T5 connects to the third clock signal Va. The first end of the sixth thin film transistor T6 connects to the first clock signal Vc through the second capacitance C2. The second end of the sixth thin film transistor T6 and the second end of the seventh thin film transistor T7 connects to the first control signal V11. The third end of the sixth thin film transistor T6, the third end of the seventh thin film transistor T7 and the third end of the eighth thin film transistor T8 connect to the second reference voltage Vss. The first end of the seventh thin film transistor T7 connects to the second end of the eighth thin film transistor T8. The first end of the eighth thin film transistor T8 connects with the third end of the first thin film transistor T1.

Figure 2:
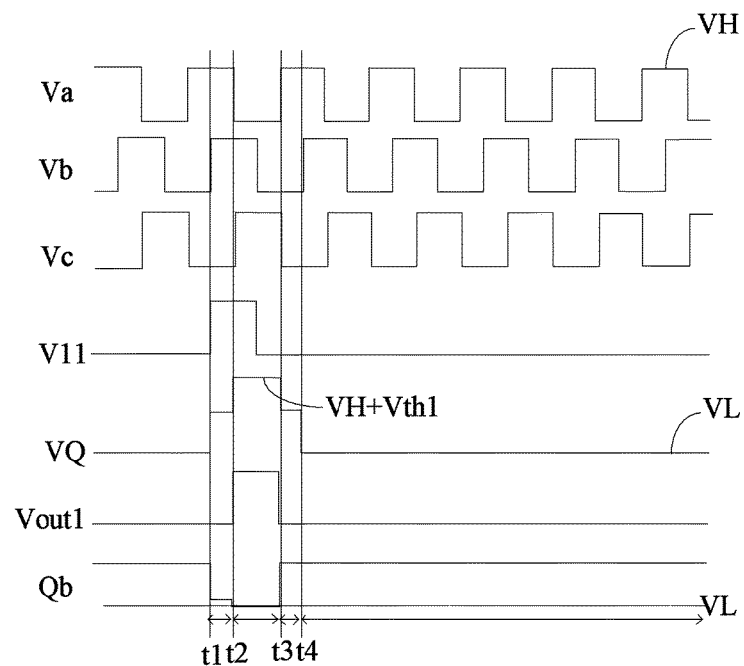
FIG. 2 is a time sequence diagram of the shift register unit in FIG. 1.

Please refer to the sequence diagram of FIG. 2, which describes the operation principle of the shift register unit disclosed by the present embodiment. The first clock signal Vc, the second clock signal Vb and the third clock signal Va are clock signals with the same period. The voltage level of the first clock signal Vc, the second clock signal Vb and the third clock signal Va is high level potential VH. The potential level of the first clock signal Vc, the second clock signal Vb and the third clock signal Va is low level VL. The third clock signal Va is ahead of the second clock signal by ¼ clock period. The third clock signal Va is ahead of the first clock signal Vc by ½ clock period. The first reference voltage Vdd is high level of which the potential is VH; the second reference voltage Vss is low level of which the potential is VL.

As shown in FIG. 2, when the time is t1, the shift register is preconditioning phase, and the first control signal V11 and the second clock signal Vb raises up to high level VH. The second thin film transistor T2 and the third thin film transistor T3 are turned on. The first control signal V11 charges to the driving control signal Qn, such that the driving control signal Qn charges to VH−Vth3. Vth3 is the voltage threshold value of the third thin film transistor T3, i.e. the voltage VQ of the control end 112 is VH−Vth3. When the driving control signal Qn is VH−Vth3, the first thin film transistor T1 is turned on. At this time, the first clock signal Vc is low level potential VL, the clock signal Vc pulls the driving signal Vout1 output from the first output end 113 down to the low level potential VL, i.e. the driving module 11 charges to the driving signal Vout1 through the first clock signal Vc based on the driving control signal Qn. When the sixth thin film transistor T6 and the seventh thin film transistor T7 are turned on, the second end of the fourth thin film transistor T4 is low level potential VL and the fourth thin film transistor T4 is cut off. The third clock signal Va is high level potential VH, and the fifth thin film transistor T5 is turned on. The potential of the second end of the eighth thin film transistor (i.e. the control end Qb of the low level maintenance mean 13) is pulled down to the low level approaching to the low level potential VL by the second voltage Vss, and the eighth thin film transistor T8 is cut off.

At the time t2 the shift register is pull-up stage. The first control signal V11 and the second clock signal Vb maintains the high level potential VH and the driving control signal Qn is VH−Vth3. The first thin film transistor T1 is turned on. When the first clock signal Vc goes up to the high level potential VH from the low level potential VL, and the driving signal Vout1 output from the first output end 113 through the first thin film transistor T1 pulls up to the high level potential VH, i.e. the driving module 11 charges to the driving signal Vout1 through the first clock signal Vc based on the driving control signal Qn. The voltage of the driving signal Vout1 goes up quickly. The third clock signal Va decreases down to the low level potential VL from the high level potential VH, and the fifth thin film transistor is cut off. The sixth thin film transistor T6 and the seventh thin film transistor T7 are turned on, and the fourth thin film transistor T4 is cut off. The potential of the second end of the eighth thin film transistor T8 (i.e. the control end Qb of the low maintenance mean 13) is totally pulled down to the low level potential VL and the eighth thin film transistor T8 is at total cut-off state. The leakage of the driving signal Vout1 output from the first output end 113 is reduce and the raising time of the driving signal Vout1 output from the first output end 113 is reduce.

When the time is between t2 and t3, the first control signal V11 and the second clock signal Vb fall down to the low level potential at the same time. The second thin film transistor T2 and the third thin film transistor T3 are cut off in order to the control end 112 (the second end of the first thin film transistor T1) being floating phase. The voltage VQ of the control end 112 rises with the raising voltage of the driving signal up to be VH+Vth1, where Vth1 is a voltage threshold value of the first thin film transistor T1 and is a bootstrap effect. The voltage of the driving signal Vout1 can go up to VH quickly.

The voltage VQ of the control end 112 is raised up higher, the driving power of the first thin film transistor T1 is stronger, and the raising time of the voltage of the driving signal Vout1 is shorter. Because the capacitance C1, the gate capacitance of the first thin film transistor T1, the parasitic capacitance of the second thin film transistor T2 and the parasitic capacitance of the thin film transistor T3 are smaller, and the second thin film transistor T2 and the third thin film transistor T3 are totally cut off during the process of the self-bootstrap effect. The leakage generated by the second thin film transistor and the third thin film transistor T3 is avoided so that the voltage of the control end 112 can be self-booted to the higher voltage.

At the time t3, the shift register unit is pull-down phrase. The first control signal V11 and the second clock signal Vb is low level potential VL. The second thin film transistor T2 and the third thin film transistor T3 are cut off. The first thin film transistor T1 is turned off. At this time, the first clock signal Vc falls down to the low level potential VL from the high level potential VH, The clock signal Va goes up to the high level potential VH from the low level potential VL. The first clock signal Vc pulls the driving signal Vout1 output from the first output end 113 down to the low level potential VL. The third clock signal Va goes up to the high level potential VH from the low level potential VL. The first clock signal Vc pulls the driving signal Vout1 output from the first output end 113 down to the low level potential VL, i.e. the driving module 11 charges to the driving signal Vout1 through the first clock signal Vc based on the driving signal Qn. The driving signal Vout1 falls down to the low level potential VL quickly. Because the self-bootstrap effect of the first capacitance C1, the voltage VQ of the control end 112 falls down to VH−Vth3.

The first control signal V11 and the second clock signal Vb is the low level potential VL, and the sixth thin film transistor T6 and the seventh thin film transistor T7 is cut off; the third clock signal Vc goes up to the high level potential VH, and the fifth thin film transistor T5 is turned on, and the first reference voltage Vdd charges to the second end of the eighth thin film transistor T8, such that the second end of the eighth thin film transistor T8 charges to the high level potential VH quickly, and the eighth thin film transistor T8 is turned on. Therefore, the driving signal Vout1 can still discharge through the eighth thin film transistor, further to reduce the descend time of the driving signal Vout1.

The driving signal Vout1 output from the first output end 113 in the shift register unit of the present embodiment charges quickly through the first thin film transistor T1 and the eighth thin film transistor T8 without the professional pull-down transistor. Therefore, the shift register unit has smaller circuit area.

After the pull-down phrase, the shift register unit completely outputs a pulse signal as shown in Vout1 of FIG. 2. Theoretically, the driving signal Vout1 should be kept at the low level potential VL, but the parasitic capacitance is between the third end (drain) and the second end (gate) of the first thin film transistor T1. When the first clock signal Vc jumps up to the high level potential VH from the low level potential VL. A coupling voltage is generated in the control end 112 under the function of the clock feedthrough effect. When the coupling voltage is too much, the first thin film transistor T1 can be turned on. The first clock Vc charges to the driving signal Vout1 incorrectly, and the driving signal Vout1 cannot be kept at the low level potential VL.

Therefore, after the time t4, the sixth thin film transistor T6 and the seventh thin film transistor T7 are still cut off. When the first clock signal Vc is high level potential VH, the first clock signal Vc makes the high level potential coupling to the second end of the fourth thin film transistor T4 through the second capacitance C2, such that the fourth thin film transistor T4 is turned on. The first reference voltage Vdd charges to the second end of the eighth thin film transistor T8. When the third clock signal Va is high level potential VH, the fifth thin film transistor T5 is turned on and the first reference voltage Vdd charges to the second end of the eighth thin film transistor T8, further to achieve the fourth thin film transistor T4 and the fifth thin film transistor T5 being turned on alternatively, such that the second end of the eighth thin film transistor T8 is kept at the high level potential VH. The shift register unit is in low level maintenance phrase, and the eighth thin film transistor T8 is turned on to keep the driver signal Vout1 at the low level potential VL.

Otherwise, the shift register unit of the present embodiment keeps at the low level maintenance phrase, a first thin film transistor T1 is turned on periodically when the third clock signal Va is high level potential, so the first control signal V11 is pulled down to the low level VL. The clock feedthrough effect of the control end 112 can be effectively inhibited.

Figure 3:
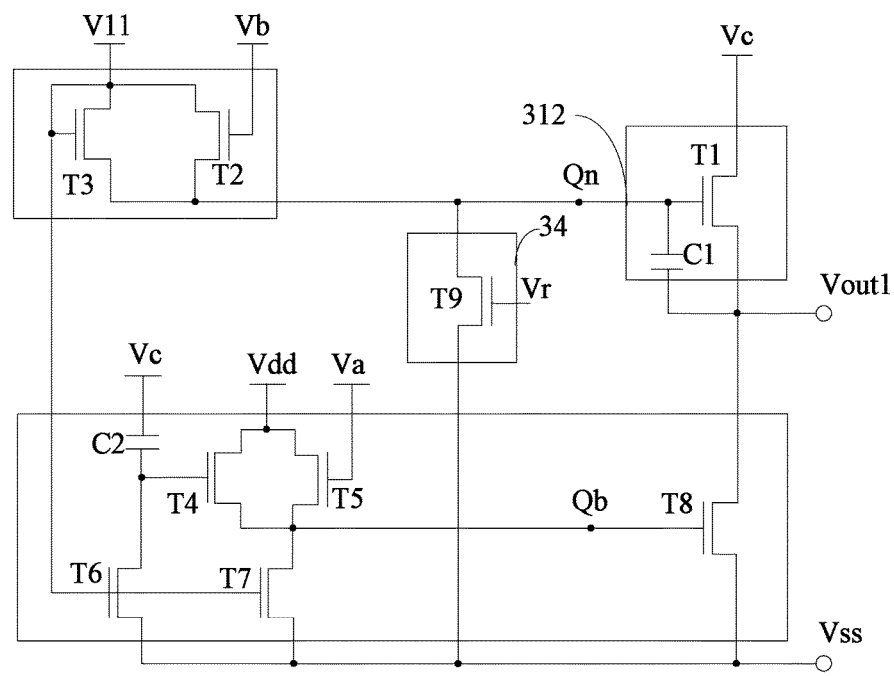
FIG. 3 is a circuit diagram of the shift register unit of the second embodiment.

The shift register unit of the second embodiment is provided. The difference from the first embodiment is that: as shown in FIG. 3, the shift register unit of the present embodiment further comprises an initialization module 34 which respectively connects to the control end 312 and the second reference voltage Vss. The initialization module 34 is used to pull the driving control signal Qn down to the low level potential VL of the second reference voltage Vss.

The initialization module 34 comprises a ninth thin film transistor T9. The first end of the ninth thin film transistor T9 connects to the second end of the first thin film transistor T1. The second end of the ninth thin film transistor T9 connects to the initialized pulse signal Vr. The third end of the ninth thin film transistor T9 connects to the second reference voltage Vss.

Figure 4:
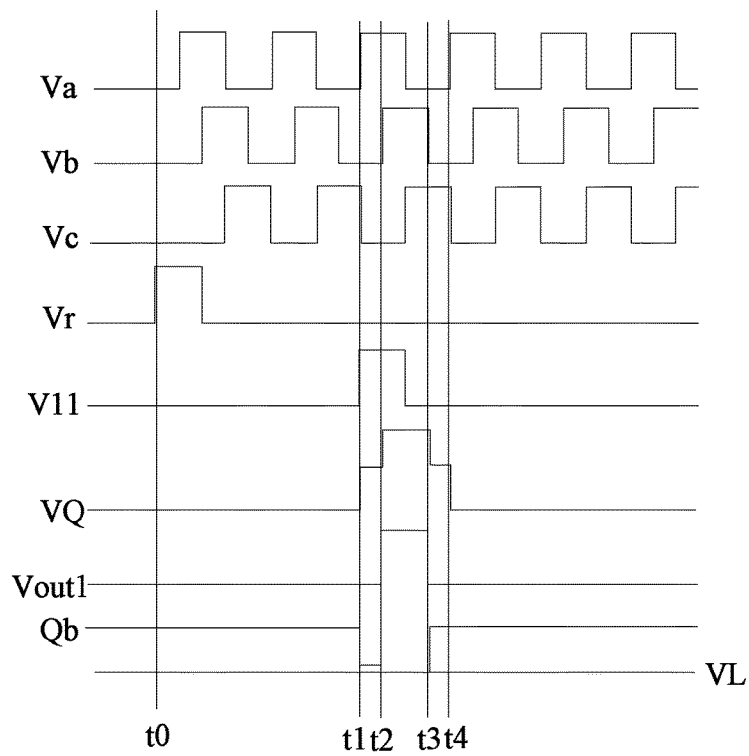
FIG. 4 is a time sequence diagram of the shift register unit in FIG. 3.

Please refer to the sequence diagram of FIG. 4. The high level potential VH of the initialized pulse signal Vr is ahead of the first control signal V11 by at least one pulse width, and the initialized pulse signal Vr rises along the rising edge of the first pulse which is ahead of the first clock signal Vc, the second clock signal Vb and the third clock signal Va.

When the time is t0, i.e. before the first clock signal Vc, the second clock signal Vb and the third clock signal Va goes up to the high level potential VH, the initialized pulse signal Vr is high level potential VH, the second reference voltage Vss pulls the driving control signal Qn down to the low level potential VL.

Compared with the shift register unit disclosed by the first embodiment, the second embodiment can inhibit the clock feedthrough effect of the control end 312 well, so that the operation of the shift register is more stable.

Figure 5:
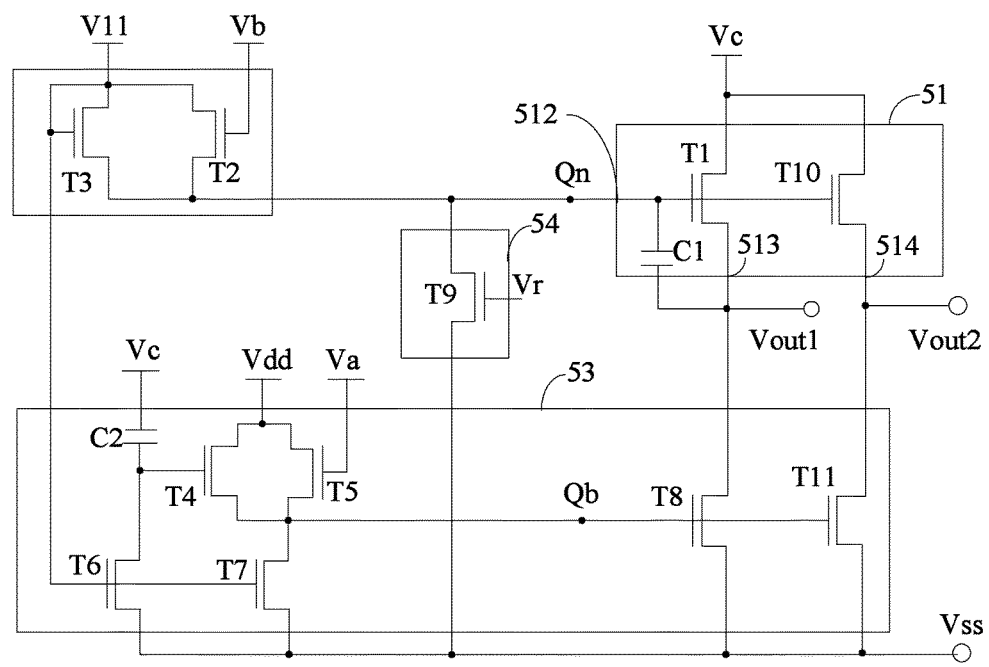
FIG. 5 is a circuit diagram of the shift register unit of the third embodiment.

The shift register of the third embodiment is provided. The difference from the second embodiment is that: the shift register disclosed by the third embodiment is used for the higher loading or lower temperature, as shown in FIG. 5. The driving module 51 further comprises the second output end 514 connects to the next level shift register for providing the next level shift register with the input signal.

The second end 514 comprises the tenth thin film transistor T10. The first end of the tenth thin film transistor T10 connects to the first clock signal Vc. The second end of the tenth thin film transistor T10 connects to the second end of the first thin film transistor T1. The third end of the ten thin film transistor T10 connects to the next level shift register unit.

The low level maintenance module 53 further comprises an eleventh thin film transistor T11. The first end of the eleven thin film transistor T11 connects to the third end of the tenth thin film transistor T10. The second end of the eleventh thin film transistor T11 connects to the second end of the eighth thin film transistor T8. The third end of the eleventh thin film transistor T11 connects the second reference voltage Vss.

Figure 6:
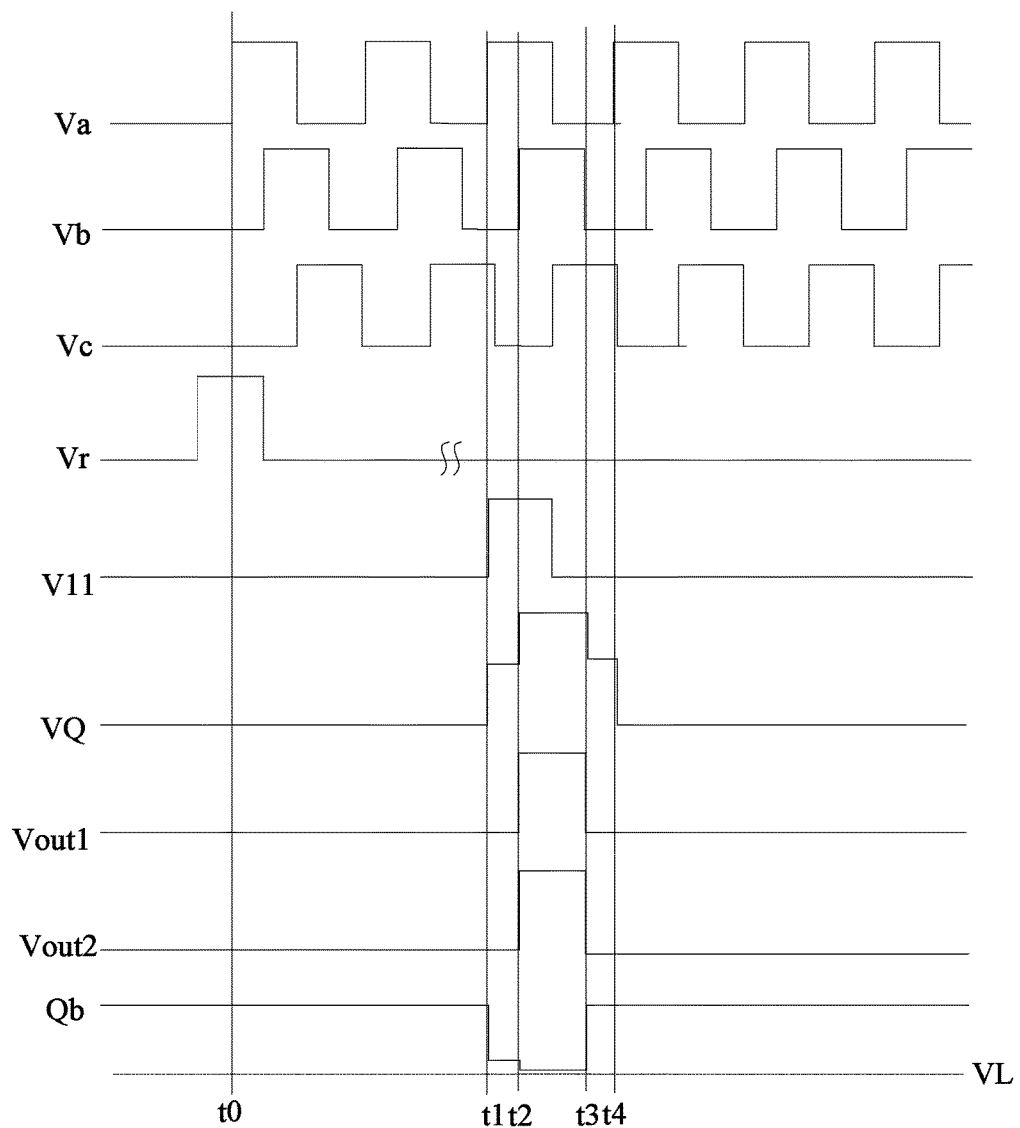
FIG. 6 is a time sequence diagram of the shift register unit in FIG. 5.

Please refer to the sequence diagram of FIG. 6. From the time t2 to t3, the shift register is pull-up phrase. The tenth thin film transistor T10 is turned on and the first clock signal Vc charges to the driving signal Vout2 output from the second output end 514.

From the time t3 to t4, the shift register is pull-down phrase. The tenth thin film transistor T10 and the eleventh thin film transistor T11 are turned on at the same time. The driving signal Vout2 output from the second output end 514 discharges through the tenth thin film transistor T10 and the eleventh thin film transistor T11.

After the time t4, the shift register is low level maintenance phrase. The eleventh thin film transistor T11 is turned on. The second reference Vss keeps the driving signal Vout2 output from the second output end 514 at low level potential.

The driving signal Vout1 output from the third end of the first thin film transistor T1 has the same sequence diagram with the driving signal Vout2 output from the second output end 514. Because the load of the second output end 514 is smaller than the load of the first output end 513, the raising time of the driving signal Vout2 is smaller than the raising time of the driving signal Vout1. The second output end 514 is used for the next stage shift register unit providing the input signal. The driving control signal Qn of the control end 512 charges rapidly to VH–Vth3 in the preconditioning phrase, such that the first thin film transistor T1 has better driving power. Therefore, the shift register disclosed by the present embodiment is suitable when the higher load and the low temperature of the first output end 513.

In other embodiment, the initialization module 54 can totally be removed by one of ordinary skill in the art.

In the embodiment, the first thin film transistor T1, the second thin film transistor T2, the third thin film transistor T3, the fourth thin film transistor T4, the fifth thin film transistor T5, the sixth thin film transistor T6, the seventh thin film transistor T7, the eighth thin film transistor T8, the ninth thin film transistor T9, the tenth thin film transistor T10 and the eleventh thin film transistor T11 are N-type thin film transistors. In other embodiment, one of the ordinary skill in the art can totally change the first thin film transistor T1, the second thin film transistor T2, the third thin film transistor T3, the fourth thin film transistor T4, the fifth thin film transistor T5, the sixth thin film transistor T6, the seventh thin film transistor T7, the eighth thin film transistor T8, the ninth thin film transistor T9, the tenth thin film transistor T10 and the eleventh thin film transistor T11 into P-type thin film transistors.

Figure 7:
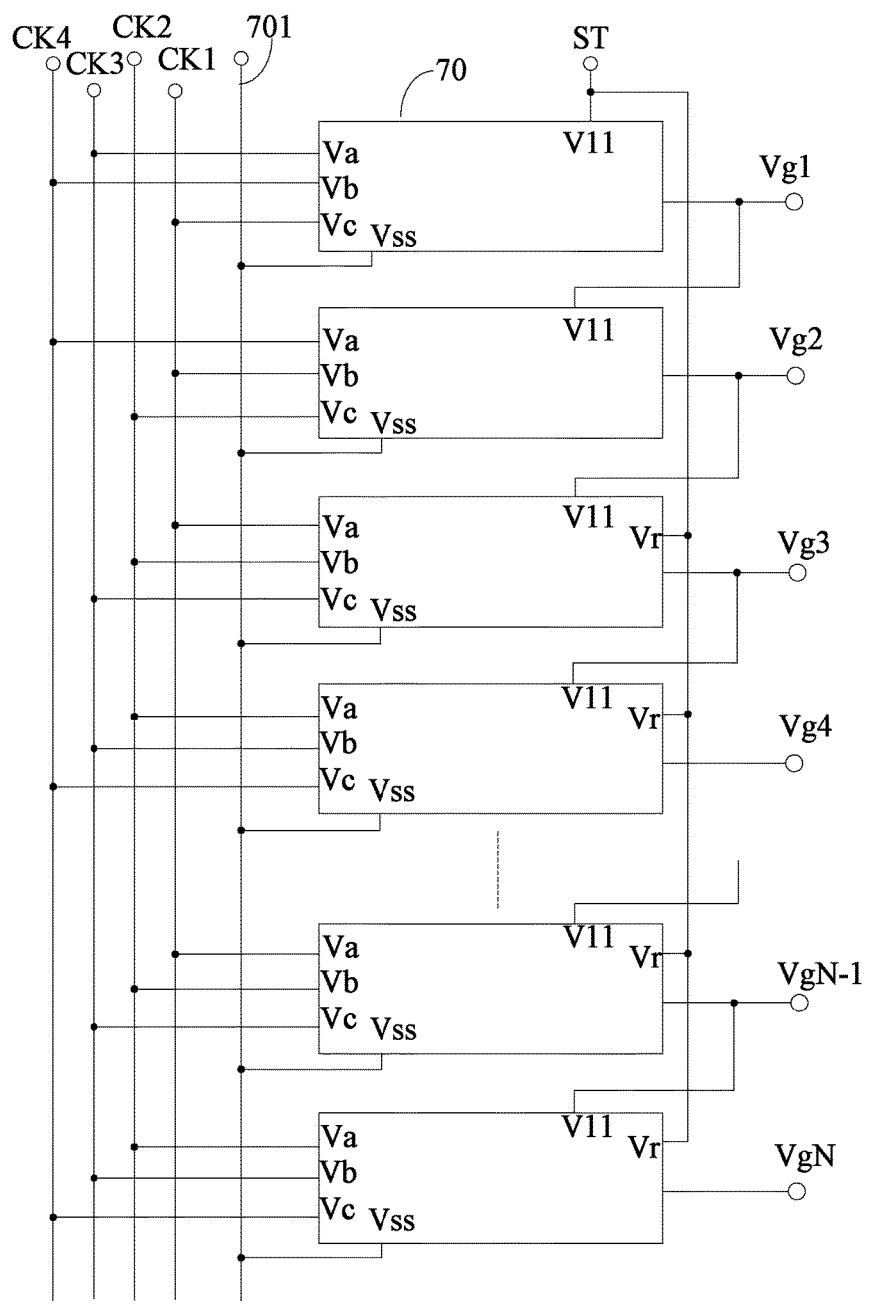
FIG. 7 is a structural diagram of the shift register unit of the first embodiment.

The shift register of the first embodiment is as shown in FIG. 7. The shift register disclosed by the present embodiment comprises Nth-stage cascade shift register unit 70, the first clock line CK1, the second clock line CK2, the third clock line CK3, the fourth clock line CK4, a common ground line 701 and the initial signal ST, where the first stage shift register unit 70 and the second stage shift register unit 70 are both the shift register units disclosed by the first embodiment. All the stage shift register form the first stage shift register unit 70 and the Nth stage shift register unit 70 are both the shift register units disclosed by the second embodiment. They are not discussed here.

The first clock signal Vc of the first stage shift register unit 70 connects to the first clock line CK1. The second clock signal Vb of the first stage shift register 70 connects to the fourth clock line CK4. The first control signal Va of the first shift register unit 70 connects to the third clock line CK3. The first control signal V11 of the first stage shift register unit 70 connects to the initial signal ST.

The second reference voltage Vss of the N stage cascade shift register unit 70 connects to the common ground line 701, which is used for providing the second reference voltage Vss with the low level potential VL. The signal from the first output end 113 of the first stage shift register unit 70 to the N stage shift register 70 is Vg1–Vgn.

The first control signal V11 of the second stage shift register unit 70 to the N stage shift register unit 70 all connects to the first output end 113 of the upper stage shift register unit 70. For example, the first control signal V11 of the n stage shift register unit 70 connects to the first output end 113 of the N–1 stage shift register unit 70.

The first clock signal Vc of the second shift register unit 70 connects to the second clock line CK2. The clock signal Vb of the second shift register unit 70 connects to the first clock line CK1. The third clock signal Va of the second shift register unit 70 connects to the fourth clock CK4.

The first clock signal Vc of the third stage shift register unit 70 connects to the third clock line CK3. The second clock signal Vb of the third stage shift register unit 70 connects to the second clock line CK2. The third clock signal Va of the third stage shift register unit 70 connects to the first clock line CK1. The initialized pulse signal Vr of the third stage shift register unit 70 connects the initial signal ST.

The first clock signal Vc of the fourth shift register unit 70 connects to the fourth clock line CK4. The second clock signal Vb of the fourth shift register unit 70 connects to the third clock line CK3. The third clock signal Va of the fourth stage shift register 70 connects to the second clock line CK2. The initialized pulse signal Vr of the fourth shift register unit 70 connects to the initial signal ST.

The first clock signal Vc of the N–1 stage shift register unit 70 connects to the third clock line CK3. The second clock signal Vb of the N–1 stage shift register unit 70 connects to the clock line CK2. The third clock signal Va of the N–1 stage shift register unit 70 connects to the first clock line CK1. The initialized pulse signal Vr of the N–1 stage shift register unit 70 connects the initial signal ST.

The first clock signal Vc of the N stage shift register unit 70 connects to the fourth clock line CK4. The second clock signal Vb of the N stage shift register unit 70 connects to the third clock line CK3. The third clock signal Va of the N stage shift register unit 70 connects to the second clock line CK2. The initialized pulse signal Vr of the N stage shift register unit 70 connects the initial signal ST.

Figure 8:
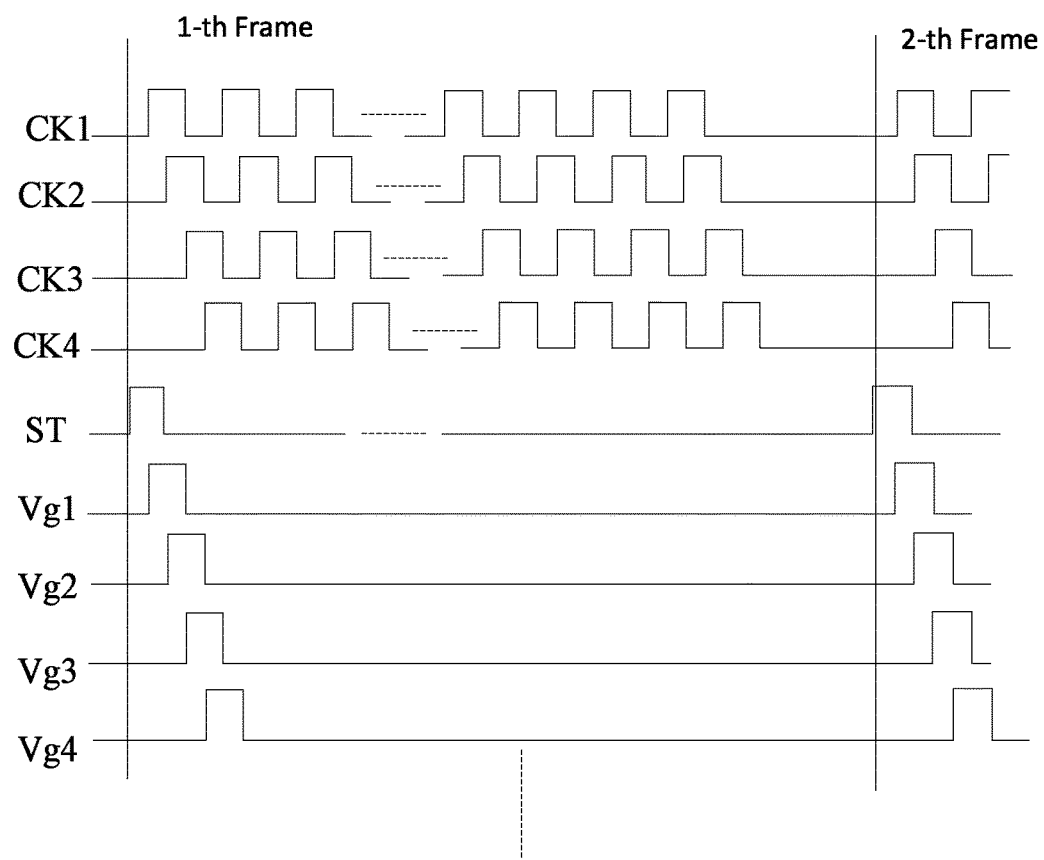
FIG. 8 is a time sequence diagram of the shift register in FIG. 7.

The sequence diagram of the shift register unit of the present embodiment is shown in FIG. 8. In the first frame, by triggering the initial signal ST, the signal Vg1–Vgn is output from the first stage shift register unit 70 to the N stage shift register unit 70 in order. In the second frame, by triggering the initial signal ST again, the signal Vg1–Vgn is output from the first stage shift register 70 to the N stage shift register 70.

Figure 9:
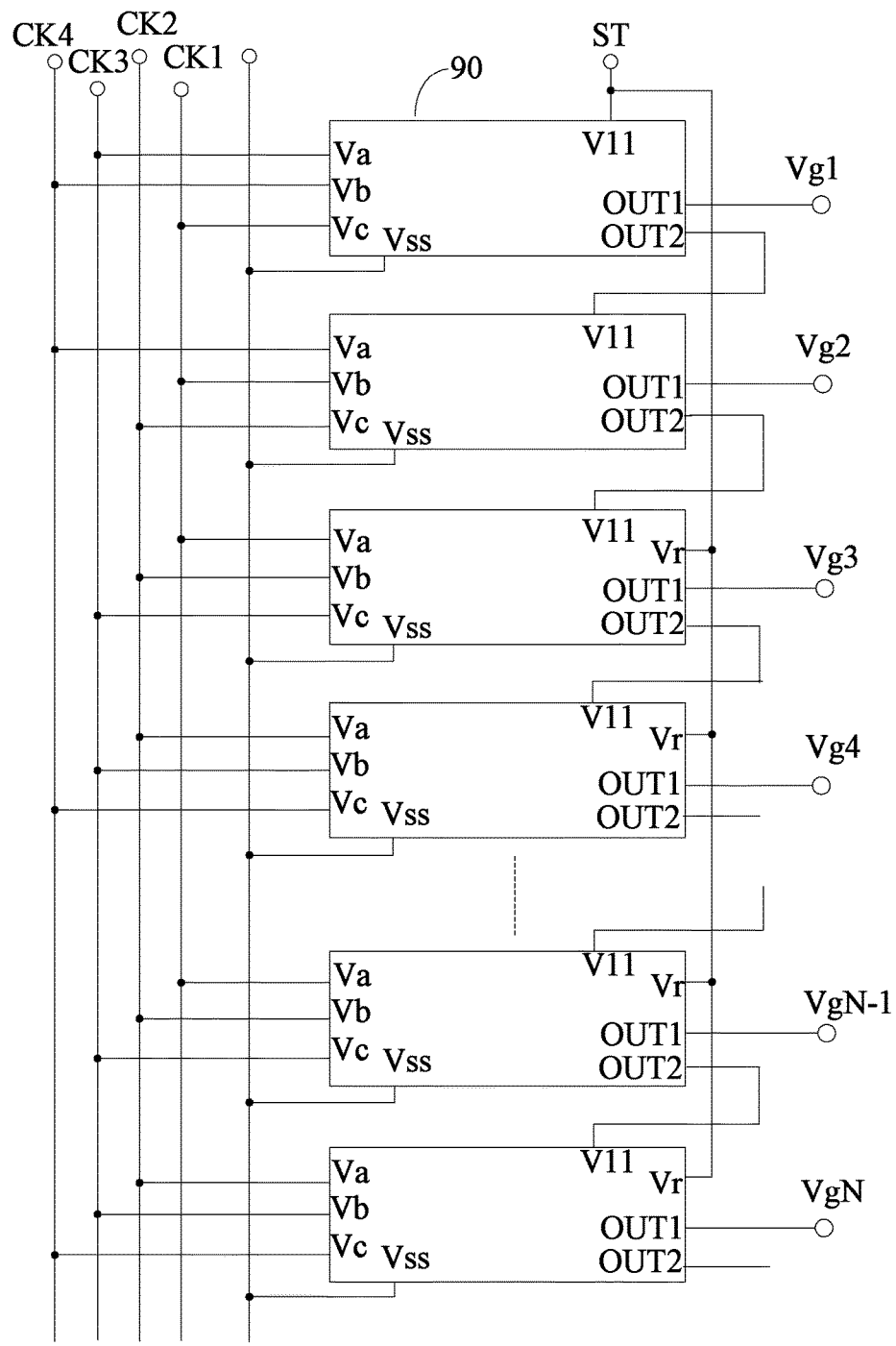
FIG. 9 is a structural diagram of the shift register of the second embodiment.

The shift register of the second embodiment is provided. The difference from the shift register of the first embodiment is as shown in FIG. 9. The third embodiment combines the first stage shift register unit to the N stage shift register which disclosed by the second embodiment and is not further described in detail. The sequence diagram of the shift register disclosed by the present embodiments is shown in FIG. 8.

In summary, the shift register comprises a plurality of stage shift register units. Each of the stage shift register unit comprises: a driving module, an input module, and a low level maintenance mean. The driving module charges or discharges to the driving signal through the first clock signal based on the driving control signal. The input module output the driving control signal based on the second clock signal and the first control signal. The low level maintenance mean keeps the driving signal at the low level potential of the second reference voltage. When the first clock signal charges to the driving signal, the low level maintenance mean breaks up the connection with the first output end to avoid the leakage from the first output end and to reduce the raising time of the driving signal. When the first signal charges to the driving signal, the low level maintenance mean connects to the first output end. The driving signal discharges quickly via the first clock signal and the low level maintenance mean. The area of the shift register is small.

Described above, those of ordinary skill in the art that may be made various other changes and modifications in accordance with the appropriate technical solutions and the technical concept of the present invention, and all such changes and modifications should belong to the protection of the present invention range.

What is claimed is:

1. A shift register, wherein the shift register comprises a plurality of shift register units, and at least one shift register unit comprises:
   a driving circuit, comprising:
     an input end, connecting to a first clock signal;
     a control end, for receiving a driving control signal;
     a first output end, for outputting a driving signal, and the driving circuit charges and discharges to the driving control signal through the first clock signal based on the driving control signal;
   an input module, connecting to the control end, the input module outputs the driving control signal based on a second clock signal and a first control signal;
   a low level maintenance mean, connecting to the first output end, for keeping level potential of the driving signal at low level potential of a second reference voltage based on a first reference voltage, a third clock signal, the first clock signal and the first control signal;
   wherein, the driving circuit comprises a first thin film transistor and a first capacitance, and a first end of the first thin film transistor connecting to the first clock signal, a second end of the first thin film transistor connecting to the input module, a third end of the first thin film transistor being used for outputting the driving signal, one end of the first capacitance connecting to a second end of the first thin film transistor, another end of the first capacitance connecting to the third end of the first thin film transistor;
   the input module comprising: a second thin film transistor and a third thin film transistor, a first end of the second thin film transistor connecting to a first end of the third thin film transistor, a second end of the second thin film transistor connecting to the second clock signal, a third end of the second thin film transistor and a third end of the third thin film transistor connecting to the second end of the first thin film transistor, the first end and the second end of the third thin film transistor connecting to the first control signal;
   the low level maintenance mean comprising: a fourth thin film transistor, a fifth thin film transistor, a sixth thin film transistor, a seventh thin film transistor, an eighth thin film transistor and a second capacitance, a first end of the fourth thin film transistor and the first end of the fifth thin film transistor connecting to the first reference voltage, a second end of the fourth thin film transistor connecting to a first end of the sixth thin film transistor, a third end of the fourth thin film transistor and a third end of the fifth thin film transistor connecting to a second end of the eighth thin film transistor, a second end of the fifth thin film transistor connecting to the third clock signal, a first end of the sixth thin film transistor connecting to the first clock signal by the second capacitance, a second end of the sixth thin film transistor and a second end of the seventh thin film transistor connecting to the first control signal, the third end of the sixth thin film transistor, the third end of the seventh thin film transistor and a third end of the eighth thin film transistor connecting to the second reference voltage, and the first end of the seventh thin film transistor connecting to the second end of the eighth thin film transistor, the first end of the eighth thin film transistor connecting to the third end of the first thin film transistor.

2. The shift register according to claim 1, wherein the shift register further comprises an initialization module, respectively connecting to the control end and the second reference voltage, the initialization module is used for pulling the driving control signal down to the low level potential of the second reference voltage.

3. The shift register according to claim 2, wherein the initialization module comprises a ninth thin film transistor, a first end of the ninth thin film transistor connecting to the second end of the first thin film transistor, a second end of the ninth thin film transistor connecting to an initialization pulse signal, a third end of the ninth thin film transistor connecting to the second reference voltage.

4. The shift register according to claim 3, wherein the driving circuit further comprises a second output end, connecting to a next stage shift register for providing an input signal for the next stage shift register.

5. The shift register according to claim 4, wherein the second output end comprises a tenth thin film transistor, a first end of the tenth thin film transistor connecting to the first clock signal, a second end of the tenth thin film transistor connecting to the second end of the first thin film transistor, a third end of the tenth thin film transistor connecting to the next stage shift register.

6. The shift register according to claim 5, wherein the low level maintenance mean further comprises an eleventh thin film transistor, a first end of the eleven thin film transistor connecting to the third end of the tenth thin film transistor, a second end of the eleventh thin film transistor connecting to the second end of the eighth thin film transistor, a third end of the eleventh thin film transistor connecting to the second reference voltage.

7. The shift register according to claim 6, wherein the first thin film transistor, the second thin film transistor, the third thin film transistor, the fourth thin film transistor, the fifth thin film transistor, the sixth thin film transistor, the seventh thin film transistor, the eighth thin film transistor, the ninth thin film transistor, the tenth thin film transistor and the eleventh thin film transistor are N-type thin film transistors.

8. A shift register, wherein the shift register comprises a plurality of shift register units, and at least one the shift register unit comprises:
a driving circuit, comprising:
an input end, connecting to a first clock signal;
a control end, for receiving a driving control signal;
a first output end, for outputting a driving signal, and the driving circuit charges and discharges to the driving control signal through the first clock signal based on the driving control signal;
an input module, connecting to the control end, the input module outputs the driving control signal based on a second clock signal and a first control signal;
a low level maintenance mean, connecting to the first output end, for keeping level potential of the driving signal at low level potential of a second reference voltage based on a first reference voltage, a third clock signal, the first clock signal and the first control signal,
wherein the driving circuit comprises a first thin film transistor and a first capacitance, and a first end of the first thin film transistor connecting to the first clock signal, a second end of the first thin film transistor connecting to the input module, a third end of the first thin film transistor being used for outputting the driving signal, one end of the first capacitance connecting to the second end of the first thin film transistor, other end of the first capacitance connecting to the third end of the first thin film transistor;
wherein the low level maintenance mean comprising: a fourth thin film transistor, a fifth thin film transistor, a sixth thin film transistor, a seventh thin film transistor, an eighth thin film transistor and a second capacitance, a first end of the fourth thin film transistor and the first end of the fifth thin film transistor connecting to the first reference voltage, a second end of the fourth thin film transistor connecting to a first end of the sixth thin film transistor, a third end of the fourth thin film transistor and a third end of the fifth thin film transistor connecting to a second end of the eighth thin film transistor, a second end of the fifth thin film transistor connecting to the third clock signal, a first end of the sixth thin film transistor connecting to the first clock signal by the second capacitance, a second end of the sixth thin film transistor and a second end of the seventh thin film transistor connecting to the first control signal, the third end of the sixth thin film transistor, the third end of the seventh thin film transistor and a third end of the eighth thin film transistor connecting to the second reference voltage, and the first end of the seventh thin film transistor connecting to the second end of the eighth thin film transistor, the first end of the eighth thin film transistor connecting to the third end of the first thin film transistor.

9. The shift register according to claim 8, wherein the input module comprising: a second thin film transistor and a third thin film transistor, a first end of the second thin film transistor connecting to a first end of the third thin film transistor, a second end of the second thin film transistor connecting to the second clock signal, a third end of the second thin film transistor and a third end of the third thin film transistor connecting to the second end of the first thin film transistor, the first end and the second end of the third thin film transistor connecting to the first control signal.

10. The shift register according to claim 8, wherein the shift register further comprises an initialization module, respectively connecting to the control end and the second reference voltage, the initialization module is used for pulling the driving control signal down to the low level potential of the second reference voltage.

11. The shift register according to claim 10, wherein the initialization module comprises a ninth thin film transistor, a first end of the ninth thin film transistor connecting to the second end of the first thin film transistor, a second end of the ninth thin film transistor connecting to initialization pulse signal, a third end of the ninth thin film transistor connecting to the second reference voltage.

12. The shift register according to claim 11, wherein the driving circuit further comprises a second output end, connecting to a next stage shift register for providing an input signal for the next stage shift register.

13. The shift register according to claim 12, wherein the second output end comprises a tenth thin film transistor, a first end of the tenth thin film transistor connecting to the first clock signal, a second end of the tenth thin film transistor connecting to the second end of the first thin film transistor, a third end of the tenth thin film transistor connecting to the next stage shift register.

14. The shift register according to claim 13, wherein the low level maintenance mean further comprises an eleventh thin film transistor, a first end of the eleven thin film transistor connecting to the third end of the tenth thin film transistor, a second end of the eleventh thin film transistor connecting to the second end of the eighth thin film transistor, a third end of the eleventh thin film transistor connecting to the second reference voltage.

15. The shift register according to claim 14, wherein the first thin film transistor, the second thin film transistor, the third thin film transistor, the fourth thin film transistor, the fifth thin film transistor, the sixth thin film transistor, the seventh thin film transistor, the eighth thin film transistor, the ninth thin film transistor, the tenth thin film transistor and the eleventh thin film transistor are N-type thin film transistors.

* * * * *